(12) United States Patent
Schunk

(10) Patent No.: US 9,177,884 B2
(45) Date of Patent: Nov. 3, 2015

(54) TWO-SIDED-ACCESS EXTENDED WAFER-LEVEL BALL GRID ARRAY (EWLB) PACKAGE, ASSEMBLY AND METHOD

(71) Applicant: Avago Technologies General IP (Singapore) Pte. Ltd., Singapore (SG)

(72) Inventor: Nikolaus W. Schunk, Maxhuette-Haidof (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/647,474

(22) Filed: Oct. 9, 2012

(65) Prior Publication Data

US 2014/0097536 A1 Apr. 10, 2014

(51) Int. Cl.
*H01L 23/31* (2006.01)
*H01L 25/10* (2006.01)
(Continued)

(52) U.S. Cl.
CPC ........ *H01L 23/3107* (2013.01); *H01L 23/5389* (2013.01); *H01L 24/05* (2013.01); *H01L 24/06* (2013.01); *H01L 24/19* (2013.01); *H01L 24/20* (2013.01); *H01L 24/24* (2013.01); *H01L 24/73* (2013.01); *H01L 24/96* (2013.01); *H01L 25/105* (2013.01); *H01L 21/561* (2013.01); *H01L 21/568* (2013.01); *H01L 24/13* (2013.01); *H01L 24/16* (2013.01); *H01L 24/81* (2013.01); *H01L 24/82* (2013.01); *H01L 25/167* (2013.01); *H01L 33/62* (2013.01); *H01L 2224/02381* (2013.01); *H01L 2224/0346* (2013.01); *H01L 2224/0384* (2013.01); *H01L 2224/0401* (2013.01); *H01L 2224/04105* (2013.01);

(Continued)

(58) Field of Classification Search
CPC ... H01L 21/4832; H01L 21/56; H01L 21/561; H01L 23/49575; H01L 23/49582; H01L 23/495; H01L 23/5384; H01L 23/562; H01L 23/3107
USPC .................... 257/40, 434, 738, 774, E31.117, 257/E21.135; 438/25
See application file for complete search history.

(56) References Cited

U.S. PATENT DOCUMENTS 4,711,997 A * 12/1987 Miller .......................... 250/216
4,713,841 A   12/1987 Porter et al.
(Continued)

FOREIGN PATENT DOCUMENTS

WO    WO 0002247    7/1999

OTHER PUBLICATIONS eWLB Embedded Wafer-Level Ball Grid Array, Aug. 2011, p. 1-2, STATS ChipPAC Ltd. Singapore.
(Continued)

*Primary Examiner* — Mamadou Diallo
*Assistant Examiner* — Christina Sylvia

(57) ABSTRACT

A two-sided-access (TSA) eWLB is provided that makes it possible to easily access electrical contact pads disposed on both the front and rear faces of the die(s) of the eWLB package. When fabricating the IC die wafer, metal stamps are formed in the IC die wafer in contact with the rear faces of the IC dies. When the IC dies are subsequently reconstituted in an artificial wafer, portions of the metal stamps are exposed through the mold of the artificial wafer. When the artificial wafer is sawed to singulate the TSA eWLB packages and the packages are mounted on PCBs, any electrical contact pad that is disposed on the rear face of the IC die can be accessed via the respective metal stamp of the IC die.

23 Claims, 6 Drawing Sheets

(51) Int. Cl.
*H01L 23/00* (2006.01)
*H01L 23/538* (2006.01)
*H01L 21/56* (2006.01)
*H01L 25/16* (2006.01)
*H01L 33/62* (2010.01)

(52) U.S. Cl.
CPC ............. *H01L 2224/05548* (2013.01); *H01L 2224/05647* (2013.01); *H01L 2224/06181* (2013.01); *H01L 2224/12105* (2013.01); *H01L 2224/131* (2013.01); *H01L 2224/16227* (2013.01); *H01L 2224/24137* (2013.01); *H01L 2224/2518* (2013.01); *H01L 2224/73259* (2013.01); *H01L 2224/94* (2013.01); *H01L 2224/96* (2013.01); *H01L 2225/1035* (2013.01); *H01L 2225/1058* (2013.01); *H01L 2924/12041* (2013.01)

(56) References Cited

U.S. PATENT DOCUMENTS

| | | | |
|---|---|---|---|
| 5,532,512 A * | 7/1996 | Fillion et al. | 257/686 |
| 6,746,898 B2 * | 6/2004 | Lin et al. | 438/113 |
| 7,048,450 B2 * | 5/2006 | Beer et al. | 385/88 |
| 7,170,049 B2 | 1/2007 | Iwanczyk et al. | |
| 7,486,847 B1 | 2/2009 | Dellmann et al. | |
| 7,536,066 B2 | 5/2009 | Kato et al. | |
| 7,863,088 B2 | 1/2011 | Brunnbauer et al. | |
| 8,064,739 B2 | 11/2011 | Binkert et al. | |
| 8,298,944 B1 * | 10/2012 | West | 438/667 |
| 8,352,009 B2 | 1/2013 | Hoarau et al. | |
| 8,642,385 B2 | 2/2014 | Xue et al. | |
| 8,642,397 B1 | 2/2014 | Gong et al. | |
| 8,742,370 B2 | 6/2014 | Tkachuk | |
| 2004/0217366 A1 | 11/2004 | Gale et al. | |
| 2004/0259282 A1 | 12/2004 | Oohata | |
| 2008/0122122 A1 | 5/2008 | Wong et al. | |
| 2008/0186702 A1 | 8/2008 | Camras et al. | |
| 2010/0061106 A1 * | 3/2010 | Shyu et al. | 362/311.02 |
| 2010/0316184 A1 | 12/2010 | Iwanczyk et al. | |
| 2011/0024916 A1 * | 2/2011 | Marimuthu et al. | 257/774 |
| 2011/0042798 A1 * | 2/2011 | Pagaila et al. | 257/692 |
| 2011/0095426 A1 * | 4/2011 | Chang | 257/738 |
| 2012/0025211 A1 * | 2/2012 | Yeh et al. | 257/82 |
| 2012/0038044 A1 * | 2/2012 | Chang et al. | 257/738 |
| 2013/0001795 A1 | 1/2013 | Lim et al. | |
| 2013/0075924 A1 * | 3/2013 | Lin et al. | 257/774 |
| 2013/0237774 A1 | 9/2013 | Schentag et al. | |
| 2013/0266255 A1 | 10/2013 | Tan et al. | |
| 2013/0320471 A1 | 12/2013 | Luan | |

OTHER PUBLICATIONS

Kitronik Ltd., "Kitronik ltd—5mm RGB LED Common Anode," Technology data Sheet & Specifications, http://www.kitronik.co.uk, 3 pages.
Thingm Labs, "Blinkm Datasheet", blinkm.thingm.com, V20100810, Thingm Labs, Pasadena, CA, 50 pages.
Wafer Level Chip Scale Package (WLCSP), Freescale Semiconductor Application Note, Aug. 2009, 16 pages, AN3846, Rev. 2.0.
"SiliconCore LED Display Products," www.silicon-core.com, SiliconCore Technology Inc., Jan. 4, 2013, 53 pages.
"Renesas to Commercialize FO-WLP Technology in MCU Product Line by 2011," /-Micronews, Advanced Packaging, Oct. 10, 2010, http://www.renesas.com.
Henry, William, "MicroLEDS Enabling New Generation of Fluorescence Instruments," BioPhotonics, www.photonics.com, 2014, 5 pages.
Dybko, Artur, "Fiber Optic Chemical Sensors," Chemical Sensors Research Group, 2005, 9 pages http://csrg.ch.pw.edu.pl/tutorials/fiber.
Bottoms et al., "An Overview of the Innovations, Emerging Technologies and Difficult Challenges Regarding the Assembly & Packaging Chapter of the ITRS," Assembly & Packaging, Jan. 15, 2009, 4 pages, Future Fab International Issue 28, Future Fab International, http://www.future-fab.com.
Garrou, P, "IFTLE 29 IEEE 3D IC Test Workshop Part 2," Solid State Technology (online), Dec. 22, 2010, (retrieved on Jun. 27, 2013), Retrieved from the internet: URL: http://www.electroiq.com/blogs/insights_from_leading_edge/2010.html.
Souriau, J, "Wafer Level Processing of 3D System in Package for RF and Data Applications," IEEE 2005, Electronic Components and Technology Conference, pp. 356-361.
Bottoms et al. "A description of what will specifically be needed to support continuation of the rapid pace of progress achieved by the electronics industry." Future Fab International, ITRS http://www.future-fab.com/documents.asp?d_ID=4912.

* cited by examiner

TWO-SIDED-ACCESS EXTENDED WAFER-LEVEL BALL GRID ARRAY (EWLB) PACKAGE, ASSEMBLY AND METHOD

TECHNICAL FIELD OF THE INVENTION

The invention relates to extended wafer-level ball grid array (eWLB) packaging technologies, and more particularly, to a two-sided-access eWLB package a TSA eWLB assembly, and a method.

BACKGROUND OF THE INVENTION

Extended, or embedded, wafer-level ball grid array (eWLB) packages are used to extend the size of a WLB package beyond the area of the integrated circuit (IC) die in order to provide it with a higher ball count and greater fan out for making electrical interconnections between the pads of the IC die and external electrical circuitry. After the IC dies have been fabricated on a semiconductor wafer, they are singulated into individual dies. The individual dies are then reconstituted on an artificial wafer, which typically comprises a piece of tape on which the dies are positioned front face down and a polymer molding material that encapsulates the dies. It should be noted that the dies that are reconstituted on the artificial wafer may be the same types of dies that were singulated from the same wafer or they may be different types of dies that were singulated from different types of wafers.

After the polymer molding material has been cured to form a mold about the dies, the tape is removed to expose the front side of the wafer, which is the side of the artificial wafer that is co-planar with the front faces of the dies. Wafer-level processes are then used to deposit and pattern layers of dielectric material and metal on the front side of the artificial wafer to form conductive traces. First ends of the conductive traces are in contact with the pads of the dies. Second ends of the conductive traces fan out away from the respective dies. Solder balls are then deposited at particular locations on the front side of the artificial wafer in contact with the second ends of the conductive traces, thereby establishing electrical interconnections between the solder balls and the pads of the respective dies. The artificial wafer is then sawed to singulate the individual eWLB packages from one another. Each singulated eWLB package contains at least one die, but may contain more than one die. In cases where the eWLB package contains more than one die, the dies may of the same type or different types.

After the eWLB packages have been singulated, an eWLB package is typically mounted on a printed circuit board (PCBs) on which other IC packages and/or other electrical components are also mounted. The eWLB package is placed on the PCB such that the solder balls of the eWLB package are in contact with electrical contacts of the PCB. The side of the eWLB package on which the solder balls are disposed is typically referred to as the front side of the package, whereas the opposite side of the eWLB package is typically referred to as the rear side of the package. A solder reflow process is then performed to permanently bond the solder balls of the eWLB package to the respective electrical contacts of the PCB. In this way, the pads of the die(s) of the eWLB package are electrically interconnected with the electrical contacts of the PCB.

In eWLB packages, any electrical wiring that needs to be made inside of the mold is made from the front side of the eWLB package. In some cases, however, electrical contact pads of the die are located on the rear face of the die, or on both the front and rear faces of the die. For example, most optoelectronic dies such as light emitting diode (LED) dies, photodiode dies and vertical cavity surface emitting laser diode (VCSEL) dies have electrical contact pads on their front and rear faces. Forming the electrical wiring that is needed to make the electrical interconnections between the solder balls of the eWLB package and electrical contact pads located inside of the mold on the rear faces of the dies can be difficult due to the fact that these contact pads are inside of the mold.

A variety of solutions to this problem have been proposed, some of which are disclosed in U.S. Pat. No. 7,048,450, which is assigned to the assignee of the present application and which is incorporated herein by reference. Such solutions typically involve creating a thru-mold via (TMV) that extends from the front side of the eWLB package to the rear side of the package and then connecting the TMV to the contact pad(s) disposed on the rear face of the die with a bond wire or a metal bridge. While such solutions work satisfactorily, they are relatively difficult to implement. Also, the use of bond wires and the like is inconsistent with one of the benefits of eWLB technology, which is that it avoids the use of bond wires and uses wafer-level processes to form the interconnections between the solder balls and the contact pads of the die.

A need exists for an eWLB package and method that allow electrical connections to be more easily made to the rear faces of the dies.

SUMMARY OF THE INVENTION

The invention is directed to a TSA eWLB package, a TSA eWLB assembly, and a method. The TSA eWLB package comprises a mold having a front side and a rear side, a redistribution layer disposed on front side of the mold, at least a first IC die disposed inside of the mold such that a front face of the first IC die is in contact with a redistribution layer disposed on a front side of the mold, a first metal stamp disposed on a rear face of the first IC die such that a portion of the metal stamp is exposed through the rear side of the mold, and at least a first solder ball disposed on the exposed portion of the metal stamp.

The TSA eWLB assembly comprises a TSA sWLB package mounted rear-side down on an upper surface of a PCB such that at least a first solder ball of the TSA eWLB package is in contact with the one of a plurality of electrical contacts disposed on the upper surface of the PCB.

The method comprises providing a TSA eWLB package and mounting the TSA eWLB package rear-side down on an upper surface of a PCB such that at least a first solder ball of the TSA eWLB package is in contact with a respective one of a plurality of electrical contacts disposed on the upper surface of the PCB.

These and other features and advantages of the invention will become apparent from the following description, drawings and claims.

DETAILED DESCRIPTION OF AN ILLUSTRATIVE EMBODIMENT

Figure 1A:
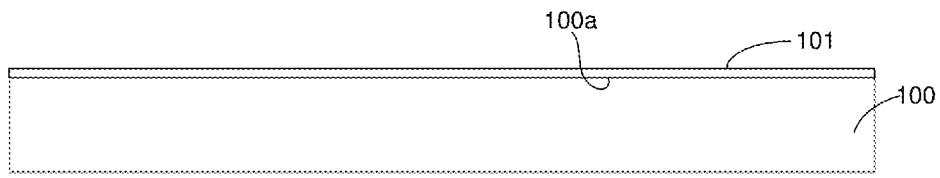
FIGS. 1A-1E illustrate an exemplary embodiment of additional wafer-level process steps that are performed on the original IC die wafer that is used for fabricating IC dies that will subsequently be used (i.e., reconstituted) in artificial wafers of TSA eWLB packages.

In accordance with the invention, a two-sided-access (TSA) eWLB is provided that makes it possible to easily access electrical contact pads disposed on both the front and rear faces of the die(s) of the eWLB package. When fabricating the IC die wafer, metal stamps are formed in the IC die wafer in contact with the rear faces of the IC dies. When the IC dies are subsequently reconstituted in an artificial wafer, portions of the metal stamps are exposed through the mold of the artificial wafer. When the artificial wafer is sawed to singulate the TSA eWLB packages and the packages are mounted on PCBs, any electrical contact pad that is disposed on the rear face of the IC die can be accessed via the respective metal stamp of the IC die. Illustrative or exemplary embodiments of the TSA eWLB package and method will now be described with reference to the figures, in which like reference numerals are used to reference like elements, features or components. It should be noted that elements, features or components in the figures are not necessarily drawn to scale.

Figure 1B:
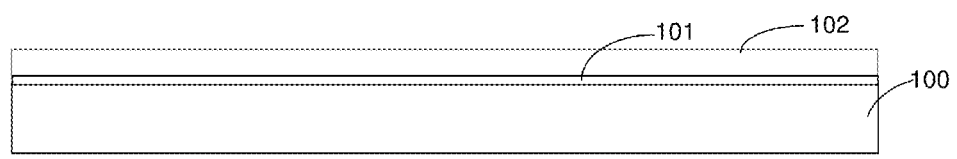
Figure 1C:
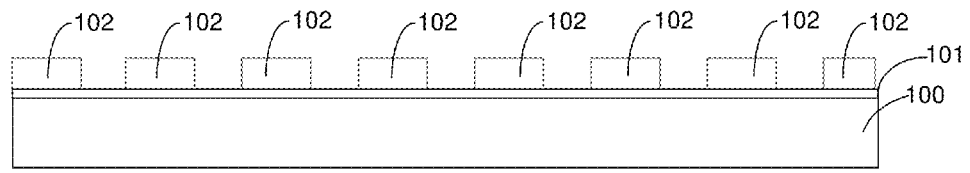

FIGS. 1A-1E illustrate additional wafer-level process steps that are performed on the original IC die wafer that is used for fabricating IC dies that will subsequently be used (i.e., reconstituted) in artificial wafers of TSA eWLB packages. After the IC dies have been fabricated in the original IC die wafer, but before the wafer has been sawed to singulate the IC dies, the process steps shown in FIGS. 1A-1E are performed. With reference to FIG. 1A, a metallization process is performed to form a metal layer 101 on a rear side 100a of an original IC die wafer 100. With reference to FIG. 1B, a coating layer (e.g., a layer of photoresist) 102 is formed on top of the metal layer 101. With reference to FIG. 1C, the coating layer 102 is then patterned by, for example, using standard photolithographic techniques to mask certain areas of the coating layer 102 while other areas of the coating layer are exposed to ultraviolet (UV) radiation and then chemically etching away the exposed regions of the coating layer 102. When the exposed areas of the coating layer 102 are etched away, areas of the metal layer 101 are exposed. Other techniques may be used to pattern the coating layer 102, such as, for example, dry etching techniques.

Figure 1D:
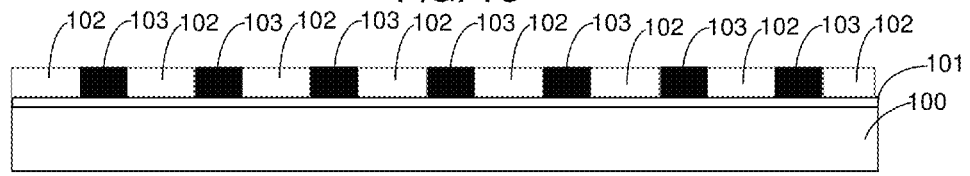
Figure 1E:
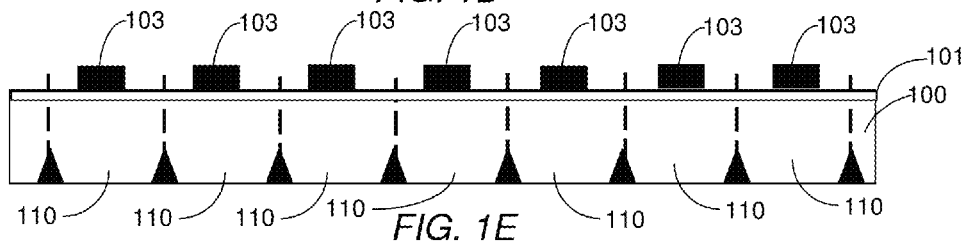

With reference to FIG. 1D, after the coating layer 102 has been patterned, metal stamps 103 are formed on top of the exposed areas of the metal layer 101. The metal stamps may 103 are typically formed through a galvanic growth process during which the stamps 103 are galvanically grown on top of the exposed areas of the metal layer 101. The metal stamps 103 may be copper stamps, for example, although other metals may instead be used for this purpose. With reference to FIG. 1E, the remaining portions of the coating layer 102 are then removed by, for example, exposing the patterned coating layer 102 to UV radiation and then chemically etching it away. This leaves the free-standing metal stamps 103 on top of the metal layer 101. The wafer 100 having the metal layer 101 and the metal stamps 103 thereon is then singulated to produce individual IC dies 110, each of which has a respective metal stamp 103 on its rear face.

Figure 2A:
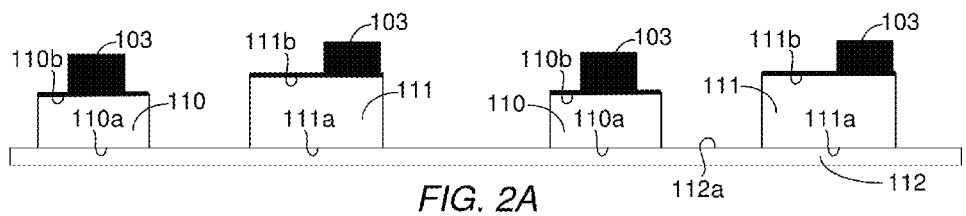
FIGS. 2A-2E illustrate an exemplary embodiment of process steps that use IC dies created during the process steps shown in FIGS. 1A-1E to fabricate individual TSA eWLB packages.

After the individual IC dies 110 have been singulated, the process of fabricating the TSA eWLB package is performed, as will now be described with reference to FIGS. 2A-2D. With reference to FIG. 2A, two different types of IC dies 110 and 111 are placed on a wafer-shaped piece of tape 112 with their front faces 110a and 111a, respectively, in contact with the upper surface 112a of the piece of tape 112 that contains a layer of adhesive material (not shown). Both types of the IC dies 110 and 111 have the metal stamps 103 disposed on their rear faces 110b and 111b, respectively. The IC dies 110 having the stamps 103 on them were made by the process described above with reference to FIGS. 1A-1E. The IC dies 111 with the stamps 103 on them, while of a different type than the IC dies 110, were also made by the process described above with reference to FIGS. 1A-1E.

Figure 2B:
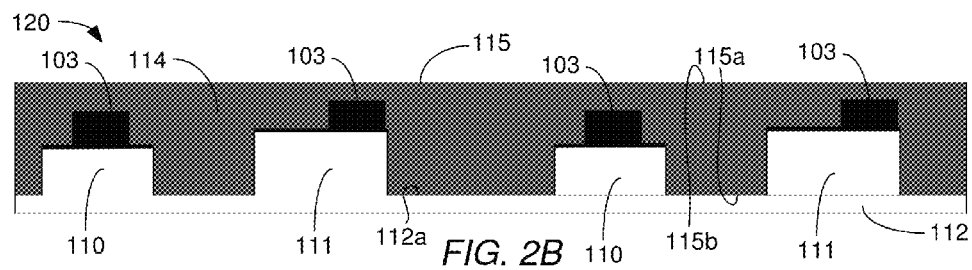

With reference to FIG. 2B, a polymer mold material 114 is then deposited over the IC dies 110, 111 such that the IC dies 110, 111, their respective stamps 103, and the upper surface 112a of the tape 112 are encapsulated in the polymer mold material 114. The polymer mold material 114 is then cured to form a hardened mold 115 having a front side 115a and a rear side 115b. The piece of tape 112, the mold 115, the dies 110, 111, and their respective stamps 103 together comprise the artificial wafer 120. As can be seen in FIG. 2B, because the IC dies 110 and 111 are of different types, the distances between their front faces 110a and 111a, respectively, and the upper surfaces 103a of the stamps 103 typically will not necessarily be equal.

Figure 2C:
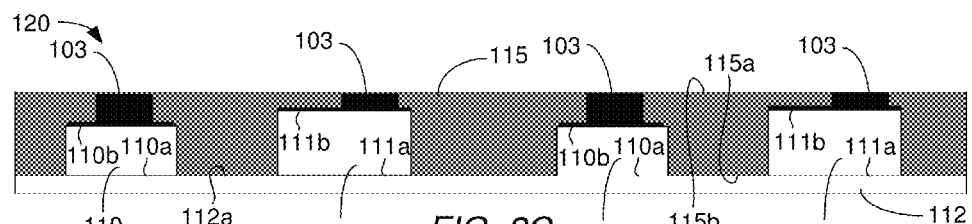

With reference to FIG. 2C, a grinding process is performed on the rear side 115b of the mold 115 to reduce the thickness of the mold 115 to the point that all of the metal stamps 103 are exposed through the rear side 115b of the mold 115. Thus, the rear faces 110b and 111b of the dies 110 and 111, respectively, are now accessible via the respective metal stamps 103 through openings formed in the rear side 115a of the mold 115.

Figure 2D:
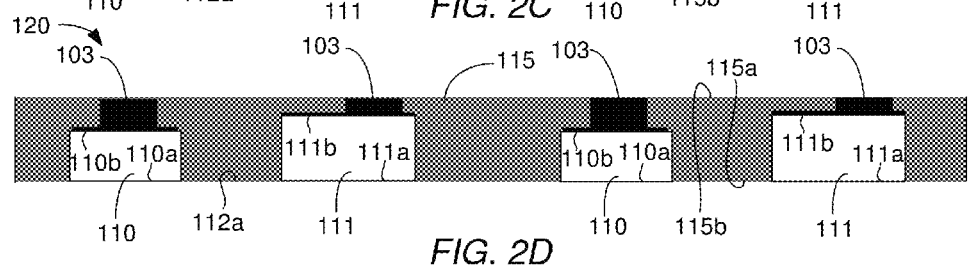

As shown in FIG. 2D, the piece of tape 112 is then removed to expose the front faces 110a and 111a of the IC dies 110 and 111, respectively, thereby making the front faces 110a and 111a of the dies 110 and 111, respectively, accessible through openings formed in the front side 115a of the mold 115.

After the wafer-level processing steps shown in FIGS. 2A-2D have been performed, additional wafer-level processing steps are performed to make electrical connections to electrical contact pads (not shown) disposed on the front faces 110a, 111a and rear faces 110b, 111b of the dies 110, 111, respectively, as will now be described with reference to FIG. 2E.

Figure 2E:
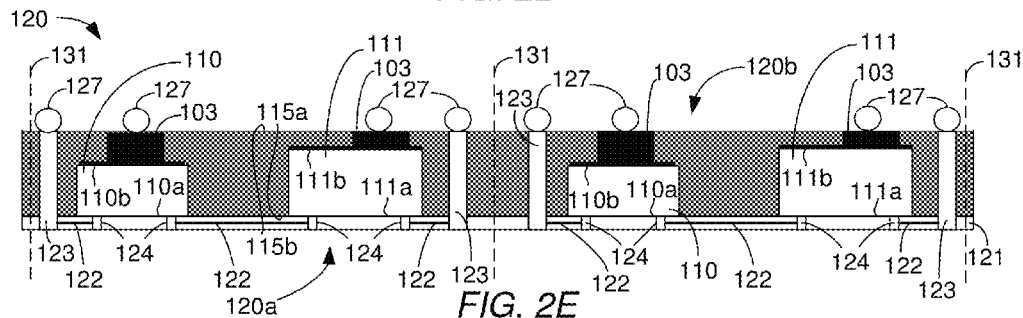

With reference to FIG. 2E, a redistribution layer 121 is built up on the front side 120a of the artificial wafer 120. The redistribution layer 121 comprises layers of metal and layers of dielectric material that are patterned to form predetermined patterns of electrical traces 122. TMVs 123 are formed in the wafer 120 that extend through the mold 115 from the front side 115*a* to the rear side 115*b* of the mold 115. The TMVs 123 are formed by drilling holes in the mold 115 and then filling the holes with an electrically-conductive material. Some of the electrically conductive traces 122 have first ends that are connected to one of the TMVs 123 and second ends that are connected to electrical contact pads 124 disposed on the front faces 110*a*, 111*a* of the dies 110, 111, respectively.

On the rear side 120*b* of the wafer 120, solder balls 127 are deposited on the TMVs 123 and on the metal stamps 103. Although the solder balls 127 are shown as being spherical in shape, the solder balls 127 are not necessarily spherical in shape and may have any shape. The term "solder ball," as that term is used herein, is intended to denote a small amount of solder having any shape that allows it to provide the necessary electrical connection. Once all of the processing steps shown in FIGS. 2A-2E have been performed, the wafer 120 is singulated at the locations represented by the dashed lines 131.

Figure 3:
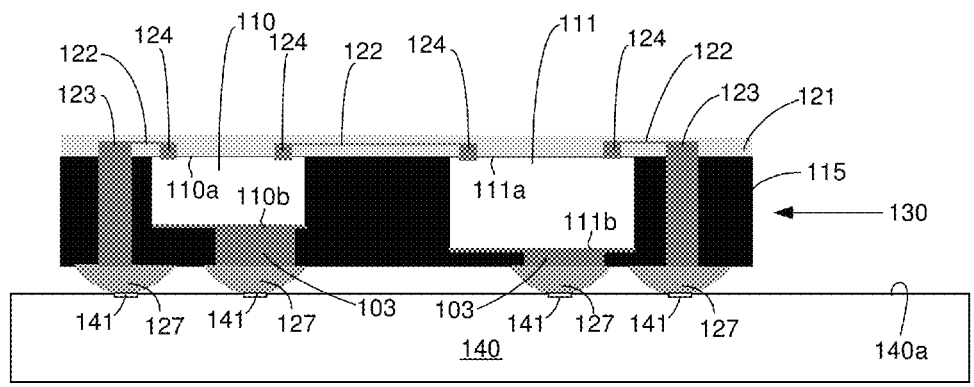
FIG. 3 illustrates a side plan view of a TSA eWLB assembly comprising a TSA eWLB package formed by the process steps shown in FIGS. 2A-2E mounted on a PCB.

FIG. 3 illustrates a side plan view of a TSA eWLB assembly comprising a TSA eWLB package 130 mounted on a PCB 140. The TSA eWLB package 130 is obtained by singulating the wafer 120 shown in FIG. 2E at the locations represented by the dashed lines 131. After the singulation process has been performed, the TSA eWLB package 130 is mounted rear side down on the PCB 140 such that the solder balls 127 are in contact with electrical contacts 141 disposed on the upper surface of the PCB 140. The contact pads 124 disposed on the front faces 110*a*, 111*a* of the dies 110, 111, respectively, are electrically connected by the electrical traces 122 to the TMVs 123, which are connected to electrical contacts 141 of the PCB 140 by the respective solder balls 127. Any contact pads (not shown) that are disposed on the rear faces 110*b*, 111*b* of the dies 110, 111, respectively, are electrically connected to electrical contacts 141 of the PCB 140 by the respective metal stamps 103 and the respective solder balls 127.

It can be seen from FIG. 3 that the configuration of the TSA eWLB package 130 allows the front faces 110*a*, 111*a* and rear faces 110*b*, 111*b* of the IC dies 110, 111, respectively, to be easily accessed without the need for using bond wires or the like to make electrical connections within the mold 115. Therefore, regardless of whether the contact pads of the dies 110, 111 are on the front faces 110*a*, 111*a* or the rear faces 110*b*, 111*b*, wafer-level processes can be used during the process of fabricating the TSA eWLB dies to make the necessary connections between the contact pads and the solder balls.

The invention is particularly well suited for making TSA eWLB packages that include at least one optoelectronic die, such as, for example, an LED, a VCSEL or a photodiode, due to the fact that such dies often have at least one electrical contact pad on their rear faces. For example, the dies 110 and 111 may correspond to, respectively: a photodiode die and a transimpedance (TIA)-post amplifier die; a VCSEL die and a VCSEL driver die; an LED die and an LED driver die; a VCSEL die and a photodiode die; and first and second LED dies. It should also be noted that in cases where the metal stamps 103 are not used for making electrical contact with contact pads of the dies, they can be used as heat dissipation devices for dissipating heat from the respective dies down into heat dissipation devices (not shown) disposed on the PCB.

Figure 4:
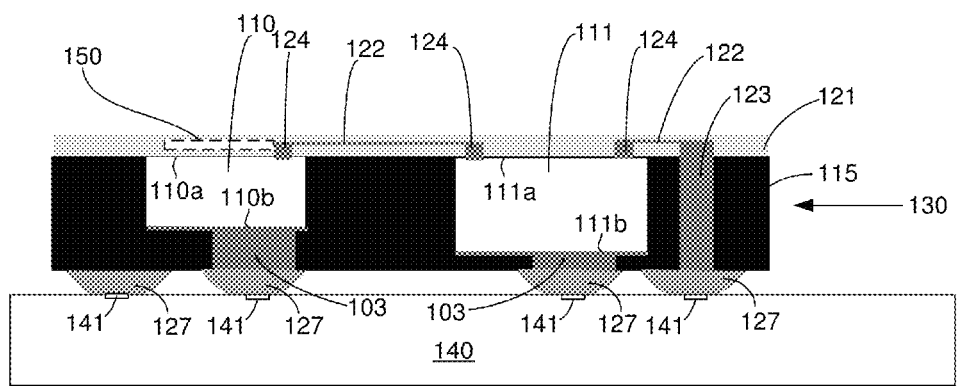
FIG. 4 illustrates a side plan view of a TSA eWLB assembly shown in FIG. 3, except that a refractive, Fresnel or holographic optical element (e.g., a lens) is formed in the dielectric layers of the redistribution layer above die.

FIG. 4 illustrates a side plan view of a TSA eWLB assembly shown in FIG. 3, except that a refractive, Fresnel or holographic optical element (e.g., a lens) 150 is formed in the dielectric layers of the redistribution layer 121 above die 110. In accordance with this illustrative embodiment, the die 110 is either a light source, such as a VCSEL or an LED, or a light receiver, such as a photodiode. The die 111 is either a driver die or a receiver IC die, depending on whether die 110 is a light source or a light receiver.

Figure 5:
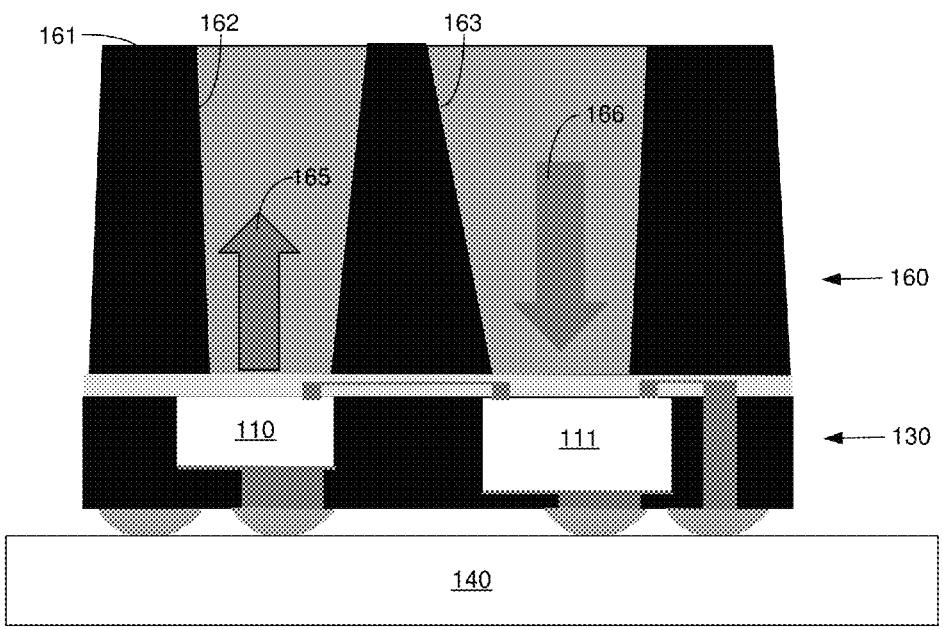
FIG. 5 illustrates a side plan view of the TSA eWLB assembly shown in FIG. 3 with a cap secured to the upper surface of the TSA eWLB package.

FIG. 5 illustrates a side plan view of the TSA eWLB assembly shown in FIG. 3 with a cap 160 secured to the upper surface 130*a* of the TSA eWLB package 130. The cap 160 is made up of a plastic mold 161 having first and second tapered optical pathways 162 and 163 formed in it. The plastic mold 161 may be made of the same material that is used to make the mold 115 of the TSA eWLB package 130. The tapered optical pathways 162 and 163 are coated with a reflective material, such as metal, for example. In accordance with this example, die 110 is a light-emitting die such as a VCSEL or an LED and die 111 is a light-receiving die such as a photodiode. Light emitted by die 110 is directed by tapered optical pathway 162 in the direction indicated by arrow 165. Tapered optical pathway 163 directs light in the direction indicated by arrow 166 onto die 111. The emitting and receiving far fields are controlled by choosing the tapering angles and lengths of the tapered optical pathways 162 and 163. Light rays emitted by the light-emitting die 110 are reflected by the inner walls of the tapered optical pathway 162 such that the far field angle of emission is reduced. On the receiving side, only light rays that fall into the opening of the tapered optical pathway 163 will be incident on the light receiving die 111. Therefore, the far field angle of reception is reduced.

Figure 6:
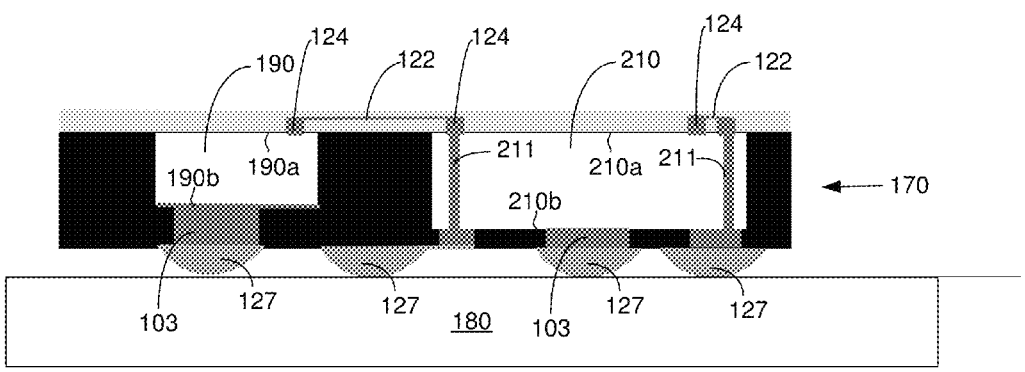
FIG. 6 illustrates a side plan view of a TSA eWLB assembly in accordance with another illustrative embodiment comprising a TSA eWLB package mounted on a PCB.

FIG. 6 a side plan view of a TSA eWLB assembly comprising a TSA eWLB package 170 mounted on a PCB 180. The TSA eWLB package 170 has first and second IC dies 190 and 210 and is made by the process described above with reference to FIGS. 1A-2E. The TSA eWLB package 170 is then mounted on the PCB 180 in the same manner described above with reference to FIG. 3. The IC dies 190 and 210 may be any types of IC dies, but for illustrative purposes, it will be assumed that the IC dies 190 and 210 are a non-silicon die and a silicon die, respectively.

In accordance with this illustrative embodiment, all electrical connections that are made to the front face 210*a* of the silicon die 210 are made by thru-silicon vias (TSVs) 211 rather than by TMVs. The TSVs 211 are connected on first ends to respective solder balls 127 and on second ends to respective electrical traces 122, which are connected to respective electrical contact pads 124 disposed on the front face 210*a* of the die 210. Electrical connections to electrical contact pads (not shown) disposed on the rear face 210*b* of the dies 190 and 210 are made through contact between the stamps 103 and the respective solder balls 127.

The TSVs 211 may be formed during the process of fabricating the original IC die wafer 100 (FIG. 1A) or they may be formed at a later time, such as during the fabrication of the artificial wafer 120 (FIGS. 2B-2E). Typically, a process known as reactive ion etching (RIE) will be used to form the TSVs 211. Because RIE is a process that is typically performed at the wafer level with very high precision, the locations and sizes of the TSVs 211 can be carefully controlled. Typically, the bores of the TSVs 211 are filled with a metal material through a galvanic growth process similar to the process that is used to grow the stamps 103. Creating the TSVs 211 is often an easier process than creating TMVs in the molds 115 (FIG. 3).

FIGS. 7A-7E illustrate another illustrative embodiment of additional wafer-level process steps that are performed on the original IC die wafer to obtain IC dies that will subsequently be used (i.e., reconstituted) in TSA eWLB artificial wafers. In other words, after the IC dies have been fabricated in the original IC die wafer, but before the wafer has been sawed to singulate the IC dies, the process steps shown in FIGS. 7A-7E are performed.

Figure 7A:
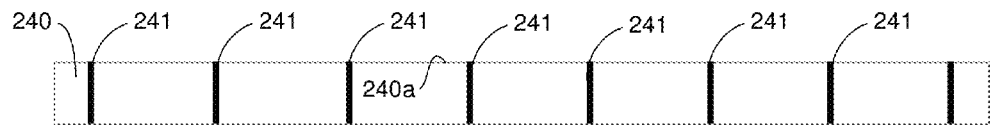
FIGS. 7A-7E illustrate another illustrative embodiment of additional wafer-level process steps that are performed on the original IC die wafer to obtain IC dies that will subsequently be used (i.e., reconstituted) in TSA eWLB artificial wafers.
Figure 7B:
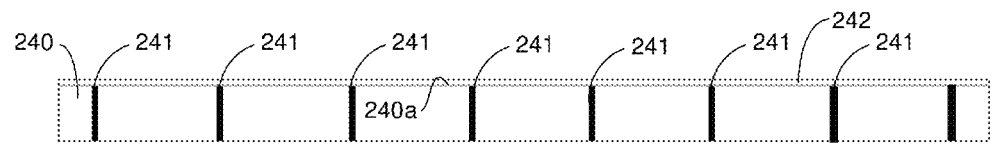
Figure 7C:
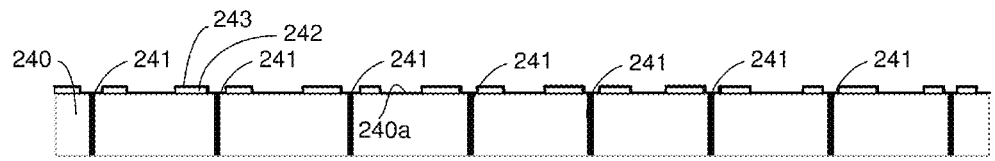

With reference to FIG. 7A, RIE and galvanic growth processes are performed on the original IC die wafer 240 to form TSVs 241 at selected locations in the wafer 240. With reference to FIG. 7B, a thin layer of silicon oxide 242 is formed on an upper surface 240*a* of the wafer 240. With reference to FIG. 7C, the silicon oxide layer 242 is then patterned by using, for example, standard photolithographic techniques to mask certain areas of the silicon oxide layer 242 while exposing the unmasked areas of layer 242 to UV radiation, and then chemically etching away the exposed areas of the layer 242. The locations where the layer 242 has been etched away correspond to areas where metal stamps and metal TSV contacts will subsequently be formed. A layer of copper 243 is then evaporated onto the remaining portions of layer 242 and exposed portions of the upper surface 240*a* of the wafer 240.

Figure 7D:
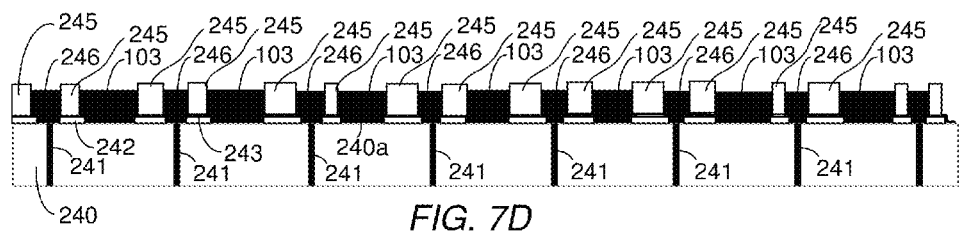

With reference to FIG. 7D, a film layer 245 is formed on top of the copper layer 243 and then openings are formed in it by using lithographic techniques such as those described above with reference to FIG. 7C. At the locations where openings have been formed in the film layer 245, metal stamps 103 and metal TSV contacts 246 are galvanically grown on top of the copper layer 243.

Figure 7E:
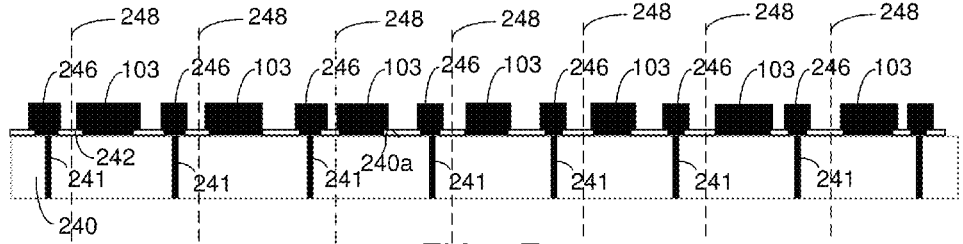

With reference to FIG. 7E, the remaining portions of the film layer 245 and the copper layer 243 are removed, leaving only the patterned silicon oxide layer 242, the metal stamps 103 and the metal TSV contacts 246 on the upper surface 240*a* of the wafer 240. The wafer 240 is then singulated at the locations indicated by dashed lines 248.

Figure 8:
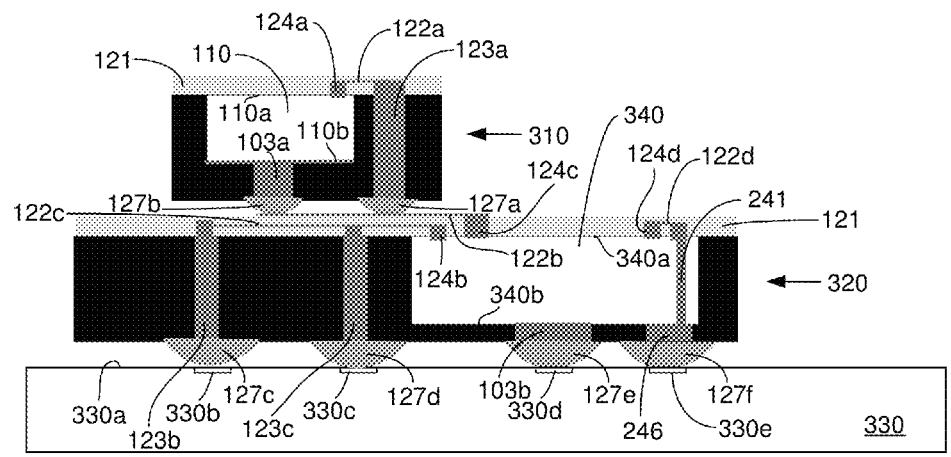
FIG. 8 illustrates a side plan view of a TSA eWLB assembly in accordance with another illustrative embodiment comprising a stack of TSA eWLB packages mounted on a PCB.

FIG. 8 illustrates a side plan view of a TSA eWLB assembly comprising a stack of TSA eWLB packages 310 and 320 mounted on a PCB 330. The TSA eWLB package 310 is fabricated by the process steps described above with reference to FIGS. 1A-2E, except that package 310 includes only die 110 (it does not include die 111). The electrical contact pad 124*a* disposed on the front face 110*a* of the die 110 is electrically connected to a solder ball 127*a* by electrical trace 122*a* and TMV 123*a*. The electrical trace 122*a* is part of the redistribution layer 121 of package 310. Any electrical contact pad (not shown) disposed on the rear face 110*b* of the die 110 is electrically connected to a solder ball 127*b* by the metal stamp 103*a*. The solder balls 127*a* and 127*b* are electrically connected to an electrical trace 122*b* of package 320. The die 110 may be an optical-to-electrical (O/E) or an electrical-to-optical (E/O) die such as, for example, a VCSEL die, an LED die or a photodiode die.

The TSA eWLB package 320 includes a silicon die 340, which may be, for example, a receiver IC die, an LED driver die or a VCSEL die, depending on the type of die 110 that is used in package 110. The package 320 may be fabricated using the process described above with reference to FIGS. 7A-7E followed by the process described above with reference to FIGS. 2B-2E. The package 320 has two TMVs 123*b* and 123*c* that are connected on first ends to respective solder balls 127*c* and 127*d* and on second ends to electrical trace 122*c*, which is connected to the electrical contact pad 124*b* disposed on the front face 340*a* of die 344. Electrical trace 122*b*, which is connected to solder balls 127*a* and 127*b*, is connected to a contact pad 124*c* disposed on the front face 340*a* of die 340. The electrical traces 122*b* and 122*c* are part of the redistribution layer 121 of package 320.

The rear face 340*b* of the die 340 is electrically connected to solder ball 127*e* by metal stamp 103*b*. A metal TSV contact 246 is also disposed on the rear face 340*b* of die 340 and is connected to a solder ball 127*f* and to a first end of a TSV 241. A second end of the TSV 241 is connected to an electrical trace 122*d*, which is connected to an electrical contact pad 124*d* disposed on the front face 340*a* of die 340. The solder balls 127*c*-127*f* are in contact with electrical contacts 330*b*-330*e*, respectively, disposed on an upper surface 330*a* of PCB 330.

Through all of these electrical connections between the PCB 330 and package 320 and between package 320 and package 310, electrical signals can be communicated between: the PCB 330 and the package 320; the package 320 and the package 310; and the PCB 330 and the package 310.

Figure 9:
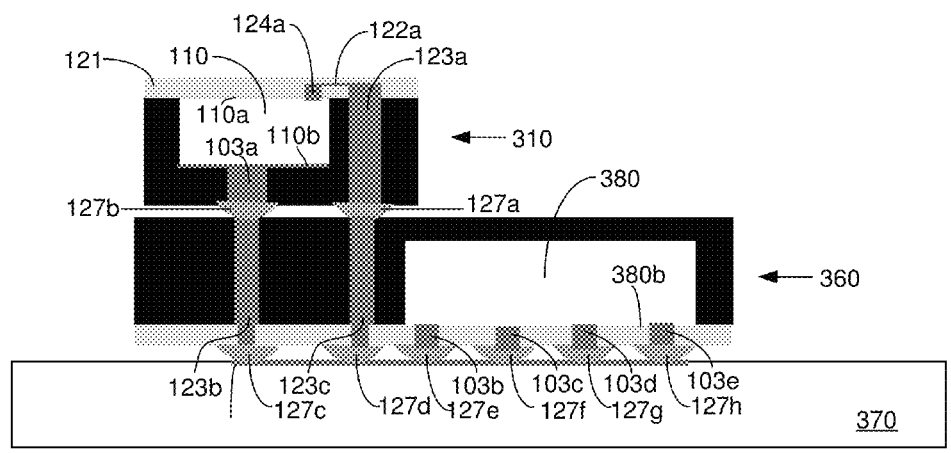
FIG. 9 illustrates a side plan view of a TSA eWLB assembly in accordance with another illustrative embodiment comprising a stack of TSA eWLB packages mounted on a PCB.

FIG. 9 illustrates a side plan view of a TSA eWLB assembly that is similar the the TSA eWLB assembly shown in FIG. 8 except that no TSVs are used in the assembly shown in FIG. 9. The TSA eWLB assembly shown in FIG. 9 comprises a stack of TSA eWLB packages 310 and 360 mounted on a PCB 370. The TSA eWLB package 310 shown in FIG. 9 is identical to the TSA eWLB package 310 shown in FIG. 8. In the assembly shown in FIG. 9, the packages 310 and 360 are positioned relative to one another such that the solder balls 127*a* and 127*b* are in contact with the TMVs 123*c* and 123*b*, respectively.

The TSA eWLB package 360 includes a silicon die 380, which may be, for example, a receiver IC die, an LED driver die or a VCSEL die, depending on the type of die 110 that is used in package 110. The package 360 may be fabricated using the same process steps that are used to fabricate package 110 since package 360 has no TSVs. The package 360 has two TMVs 123*b* and 123*c* that are connected on first ends to respective solder balls 127*c* and 127*d* and on second ends to solder balls 127*b* and 127*a*, respectively.

The rear face 380*b* of the die 380 is electrically connected to solder balls 127*e*-127*h* by metal stamps 103*b*-103*e*, respectively. All of the solder balls 127*c*-127*h* are in contact with electrical wiring 371 disposed on the upper surface 370*a* of the PCB 370. Through all of these electrical connections between the PCB 370 and the packages 310 and 360, electrical signals can be communicated between: the PCB 370 and the package 310; the package 310 and the package 360; and the PCB 370 and the package 360.

It can be seen from the description of the illustrative embodiments provided above that the TSA eWLB package of the invention provides the advantage of allowing electrical contact pads disposed on the front and/or the rear faces of the IC dies to be easily accessed. In particular, the invention allows wafer-level processes to be used to create the electrically-conductive pathways that are needed in the packages in order to electrically connect the electrical contact pads of the IC dies with the electrical contacts of the PCB. Consequently, the electrical connections can be made with greater precision, at reduced manufacturing costs and with higher manufacturing yield.

It should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. For example, the invention has been described with respect to examples of particular configurations of TSA eWLB packages made using methods of the invention, but the invention is not limited with respect to the particular configurations of the TSA eWLB packages. The invention also is not limited to the particular sequences of process steps described above with reference to the figures. Persons of skill in the art will understand that many variations can be made to the illustrative embodiments without deviating from the scope of the invention.

What is claimed is:

1. A two-sided-access extended, or embedded, wafer-level ball grid array (TSA eWLB) package comprising:
   a mold having a front side and a rear side;
   a redistribution layer disposed on front side of the mold, the redistribution layer including layers of metal and layers of dielectric material that are patterned to form predetermined patterns of electrical traces;
   at least a first integrated circuit (IC) die disposed inside of the mold such that a front face of the first IC die is in contact with the redistribution layer, the front face of the die having at least a first electrical contact pad disposed thereon that is in contact with the redistribution layer;
   a first metal stamp disposed on a rear face of the first IC die, wherein a portion of the metal stamp is exposed through the rear side of the mold, the rear face of the die having at least a first electrical contact pad disposed thereon that is in contact with the first metal stamp, and wherein the first IC die is free of any electrical connection through the first IC die between the metal stamp and the first electrical contact pad disposed on the front face of the die, and is free of any electrical connection through the first IC die between the first electrical contact pad disposed on the rear face of the die and the first electrical contact pad disposed on the front face of the die;
   at least a first solder ball disposed on the exposed portion of the metal stamp;
   at least a second IC die disposed inside of the mold such that a front face of the second IC die is in contact with the redistribution layer;
   a second metal stamp disposed on a rear face of the second IC die, wherein a portion of the second metal stamp is exposed through the rear side of the mold;
   at least a second solder ball disposed on the exposed portion of the second metal stamp; and
   at least a first thru-via (TV) comprising a hole that extends from the rear side of the mold to the front side of the mold and that is filled with an electrically-conductive material, wherein a first end of the first TV is located on the rear side of the mold and a second end of the first TV is located on the front side of the mold; and
   at least a third solder ball disposed on the first end of the first TV wherein the third solder ball is electrically connected to a second electrical contact pad disposed on the front face of the first IC die by a first electrical trace of the redistribution layer.

2. The TSA eWLB package of claim 1, wherein the first and second IC dies are of different types.

3. The TSA eWLB package of claim 1, wherein the second IC die has at least a first electrical contact pad disposed on the front faces thereof, and wherein the first electrical contact pads disposed on the front faces of the first and second IC dies are electrically interconnected with one another by a second electrical trace of the redistribution layer.

4. The TSA eWLB package of claim 1, wherein:
   the first thru-via (TV) comprises a first thru-mold via (TMV) formed in the mold.

5. The TSA eWLB package of claim 1, wherein the second IC die is a silicon die, and wherein:
   the first thru-via (TV) comprises a first thru-silicon via (TSV) formed in the second IC die, the first TSV comprising a hole that extends from the rear face of the second IC die to the front face of the second IC die and that is filled with an electrically-conductive material, wherein a first end of the first TSV is located on the rear face of the second IC die and a second end of the first TSV is located on the front face of the second IC die;
   a first TSV electrical contact disposed on the rear face of the second IC die in contact with the first end of the first TSV; and
   wherein the third solder ball is disposed on the first TSV electrical contact.

6. The TSA eWLB package of claim 5, wherein the second end of the first TSV is electrically connected to the second electrical contact pad disposed on the front face of the second IC die by the first second electrical trace of the redistribution layer.

7. The TSA eWLB package of claim 1, further comprising:
   an optical element formed in a portion of the redistribution layer that is located adjacent the front face of the first IC die.

8. The TSA eWLB package of claim 7, wherein the optical element is a refractive lens.

9. The TSA eWLB package of claim 7, wherein the optical element is a Fresnel lens.

10. The TSA eWLB package of claim 7, wherein the optical element is a holographic element.

11. A two-sided-access extended, or embedded, wafer-level ball grid array (TSA eWLB) assembly comprising:
    a TSA eWLB package comprising:
       a mold having a front side and a rear side,
       a redistribution layer disposed on front side of the mold, the redistribution layer including layers of metal and layers of dielectric material that are patterned to form predetermined patterns of electrical traces,
       at least a first integrated circuit (IC) die disposed inside of the mold such that a front face of the first IC die is in contact with the redistribution layer, the front face of the first IC die having at least a first electrical contact pad disposed thereon that is in contact with the redistribution layer,
       a first metal stamp disposed on a rear face of the first IC die, wherein a portion of the metal stamp is exposed through the rear side of the mold, the rear face of the first IC die having at least a first electrical contact pad disposed thereon that is in contact with the first metal stamp, and wherein the first IC die is free of any electrical connection through the first IC die between the metal stamp and the first electrical contact pad disposed on the front face of the die, and is free of any electrical connection through the first IC die between the first electrical contact pad disposed on the rear face of the die and the first electrical contact pad disposed on the front face of the die, and
    at least a first solder ball disposed on the exposed portion of the metal stamp,
    at least a second IC die disposed inside of the mold such that a front face of the second IC die is in contact with the redistribution layer;
    a second metal stamp disposed on a rear face of the second IC die, wherein a portion of the second metal stamp is exposed through the rear side of the mold,
    at least a second solder ball disposed on the exposed portion of the second metal stamp,
    at least a first thru-via (TV) comprising a hole that extends from the rear side of the mold to the front side of the mold and that is filled with an electrically-conductive material, wherein a first end of the first TV is located on the rear side of the mold and a second end of the first TV is located on the front side of the mold; and
    at least a third solder ball disposed on the first end of the first TV wherein the third solder ball is electrically connected to a second electrical contact pad disposed on the front face of the first IC die by a first electrical trace of the redistribution layer; and a printed circuit board (PCB) having an upper surface and a lower surface, the upper surface having electrical contacts disposed thereon, the TSA eWLB package being mounted rear-side down on the upper surface of the PCB such that said at least a first solder ball, second solder ball, and third solder ball of the TSA eWLB package are each in contact with a different one of the electrical contacts disposed on the upper surface of the PCB.

12. The TSA eWLB assembly of claim 11, wherein the first and second IC dies are of different types.

13. The TSA eWLB assembly of claim 11, wherein the second IC die has at least a first electrical contact pad disposed on the front face thereof, and wherein the first electrical contact pads disposed on the front faces of the first and second IC dies are electrically interconnected with one another by a second electrical trace of the redistribution layer.

14. The TSA eWLB assembly of claim 11, wherein the first thru-via (TV) comprises a first thru-mold via (TMV) formed in the mold.

15. The TSA eWLB assembly of claim 11, wherein the second IC die is a silicon die, and wherein:
the first thru-via (TV) comprises a first thru-silicon via (TSV) formed in the second IC die, the first TSV comprising a hole that extends from the rear face of the second IC die to the front face of the second IC die and that is filled with an electrically-conductive material, wherein a first end of the first TSV is located on the rear face of the second IC die and a second end of the first TSV is located on the front face of the second IC die;
a first TSV electrical contact disposed on the rear face of the second IC die in contact with the first end of the first TSV; and
wherein the third solder ball is disposed on the first TSV electrical contact.

16. The TSA eWLB assembly of claim 15, wherein the second end of the first TSV is electrically connected to the second electrical contact pad disposed on the front face of the second IC die by the first electrical trace of the redistribution layer.

17. The TSA eWLB assembly of claim 11, wherein the first IC die is an electrical-to-optical converter and the second IC die is an optical-to-electrical converter, and wherein the assembly further comprises:
a cap secured to the front side of the mold, the cap having first and second optical pathways formed therein, the first and second optical pathways being located above the first and second IC dies, respectively, the first optical pathway directing light emitted by the first IC die in a direction that is away from the first IC die and generally normal to the front face of the first IC die, the second optical pathway directing light that falls onto the assembly and onto the second optical pathway in a direction that is toward the second IC die and generally normal to the front face of the second IC die.

18. A method for providing a two-sided-access extended, or embedded, wafer-level ball grid array (TSA eWLB) assembly comprising:
providing a TSA eWLB package comprising:
a mold having a front side and a rear side,
a redistribution layer disposed on front side of the mold, the redistribution layer including layers of metal and layers of dielectric material that are patterned to form predetermined patterns of electrical traces, at least a first integrated circuit (IC) die disposed inside of the mold such that a front face of the first IC die is in contact with the redistribution layer, the front face of the first IC die having at least a first electrical contact pad disposed thereon that is in contact with the redistribution layer,
a first metal stamp disposed on a rear face of the first IC die, wherein a portion of the metal stamp is exposed through the rear side of the mold, the rear face of the first IC die having at least a first electrical contact pad disposed thereon that is in contact with the first metal stamp, and wherein the first IC die is free of any electrical connection through the first IC die between the metal stamp and the first electrical contact pad disposed on the front face of the die, and is free of any electrical connection through the first IC die between the first electrical contact pad disposed on the rear face of the die and the first electrical contact pad disposed on the front face of the die,
at least a first solder ball disposed on the exposed portion of the metal stamp,
at least a second IC die disposed inside of the mold such that a front face of the second IC die is in contact with the redistribution layer,
a second metal stamp disposed on a rear face of the second IC die, wherein a portion of the second metal stamp is exposed through the rear side of the mold,
at least a second solder ball disposed on the exposed portion of the second metal stamp,
at least a first thru-via (TV) comprising a hole that extends from the rear side of the mold to the front side of the mold and that is filled with an electrically-conductive material, wherein a first end of the first TV is located on the rear side of the mold and a second end of the first TV is located on the front side of the mold, and
at least a third solder ball disposed on the first end of the first TV wherein the third solder ball is electrically connected to a second electrical contact pad disposed on the front face of the first IC die by a first electrical trace of the redistribution layer; and
mounting the TSA eWLB package rear-side down on an upper surface of a printed circuit board (PCB) such that said at least a first solder ball, second solder ball, and third solder ball of the TSA eWLB package are each in contact with a respective one of a plurality of electrical contacts disposed on the upper surface of the PCB.

19. The method of claim 18, wherein the first and second IC dies are of different types.

20. The method of claim 18, wherein the second IC die has at least a first electrical contact pad disposed on the front faces thereof, and wherein the first electrical contacts disposed on the front faces of the first and second IC dies are electrically interconnected with one another by a second electrical trace of the redistribution layer.

21. The method of claim 18, wherein:
the first thru-via (TV) comprises a first thru-mold via (TMV) formed in the mold.

22. The method assembly of claim 18, wherein the second IC die is a silicon die, and wherein:
the first thru-via (TV) comprises a first thru-silicon via (TSV) formed in the second IC die, the first TSV comprising a hole that extends from the rear face of the second IC die to the front face of the second IC die and that is filled with an electrically-conductive material, wherein a first end of the first TSV is located on the rear face of the second IC die and a second end of the first TSV is located on the front face of the second IC die;

a first TSV electrical contact disposed on the rear face of the second IC die in contact with the first end of the first TSV; and wherein the third solder ball is disposed on the first TSV electrical contact.

23. The method of claim 22, wherein the second end of the first TSV is electrically connected to the second electrical contact pad disposed on the front face of the second IC die by the first electrical trace of the redistribution layer.

* * * * *